US008878708B1

(12) United States Patent
Sanders et al.

(10) Patent No.: US 8,878,708 B1
(45) Date of Patent: Nov. 4, 2014

(54) SYSTEMS AND METHODS FOR PROCESSING AND RECORDING AUDIO

(75) Inventors: Glenn Norman Sanders, Franklin Lakes, NJ (US); Howard Glenn Stark, Sparta, NJ (US)

(73) Assignee: Zaxcom, Inc., Pomptom Plains, NJ (US)

( * ) Notice: Subject to any disclaimer, the term of this patent is extended or adjusted under 35 U.S.C. 154(b) by 421 days.

(21) Appl. No.: 13/441,631

(22) Filed: Apr. 6, 2012

(51) Int. Cl.
 *H03M 1/62* (2006.01)
 *H03M 1/84* (2006.01)
 *H03M 1/70* (2006.01)
 *H03M 1/12* (2006.01)

(52) U.S. Cl.
 CPC . *H03M 1/70* (2013.01); *H03M 1/12* (2013.01)
 USPC .......................................... 341/139; 341/155

(58) Field of Classification Search
 CPC ......... H03M 1/12; H03M 1/70; H03M 1/742; H03M 1/745
 USPC .......................... 341/139, 144, 155, 143, 131
 See application file for complete search history.

(56) References Cited

U.S. PATENT DOCUMENTS

| 4,743,981 | A | | 5/1988 | Spencer et al. |
| 4,879,751 | A | | 11/1989 | Franks et al. |
| 5,164,726 | A | * | 11/1992 | Bernstein et al. ............. 341/120 |
| 5,467,288 | A | | 11/1995 | Fasciano et al. |
| 5,551,016 | A | | 8/1996 | Loeb et al. |
| 5,668,884 | A | | 9/1997 | Clair, Jr. et al. |
| 6,678,501 | B1 | | 1/2004 | Valeski |
| 6,862,429 | B2 | | 3/2005 | Efron et al. |
| 6,970,568 | B1 | | 11/2005 | Freeman et al. |
| 6,978,116 | B2 | | 12/2005 | Burr, Jr. et al. |
| 7,079,026 | B2 | | 7/2006 | Smith |
| 7,120,463 | B2 | | 10/2006 | Mathews |
| 7,162,227 | B2 | | 1/2007 | Howard |
| 7,194,139 | B1 | | 3/2007 | Sariel et al. |
| 7,277,551 | B2 | | 10/2007 | Miura et al. |
| 7,277,692 | B1 | | 10/2007 | Jones et al. |
| 7,295,809 | B2 | | 11/2007 | Moore |
| 7,409,064 | B2 | | 8/2008 | Watanuki |
| 7,434,154 | B2 | | 10/2008 | Konetski |
| 7,440,750 | B2 | | 10/2008 | Howard |
| 7,451,177 | B1 | | 11/2008 | Johnson et al. |
| 7,711,443 | B1 | | 5/2010 | Sanders et al. |
| 7,751,795 | B2 | | 7/2010 | McCarty et al. |
| 2001/0034214 | A1 | | 10/2001 | Koike |
| 2002/0026256 | A1 | | 2/2002 | Hilton |

(Continued)

OTHER PUBLICATIONS

Nagra/Kudeslki, Chapter 1, Operating Instructions and Reference Manual, May 2003, 16 pp.

(Continued)

*Primary Examiner* — Peguy Jean Pierre
(74) *Attorney, Agent, or Firm* — Rita C. Chipperson; Chipperson Law Group, P.C.

(57) ABSTRACT

Improved systems and methods for processing and recording audio received from one or more wired or wireless devices. In one aspect, the dynamic range of an analog-to-digital conversion system is extended. In another aspect, processes for generating a timecode, displaying and/or freezing a timecode display, and displaying an electronic timecode slate. Displaying a timecode slate may include rotating the orientation of the timecode display one hundred and eighty degrees to allow the timecode display to appear upright to individuals and/or equipment viewing and/or recording same. Displaying a timecode slate may also include an audible tone for synchronization of audio and video recordings.

14 Claims, 7 Drawing Sheets

(56) References Cited

U.S. PATENT DOCUMENTS

| | | |
|---|---|---|
| 2002/0193066 A1 | 12/2002 | Connelly |
| 2003/0008627 A1 | 1/2003 | Efron et al. |
| 2005/0266801 A1 | 12/2005 | Mathews |
| 2006/0141437 A1 | 6/2006 | Wakamoto |
| 2006/0292980 A1 | 12/2006 | Marcos |
| 2007/0009112 A1 | 1/2007 | Efron |
| 2007/0050197 A1 | 3/2007 | Efron et al. |
| 2007/0087686 A1 | 4/2007 | Holm et al. |
| 2008/0113326 A1 | 5/2008 | Wakamoto |
| 2009/0096517 A1 * | 4/2009 | Huang et al. .................. 327/556 |

OTHER PUBLICATIONS

Nagra/Kudelski, Chapter 3, Operating Instructions and Reference Manual, Oct. 2002, 8 pp.
Nagra/Kudelsi, Chapter 5, Operating Instructions and Reference Manual, May 2003, 3 pp.
Nagra/Kudelski, Nagra V 24 Bit Linear Location Recorder, Oct. 2002, 2 pp.
Www.blackvideo.com, Miniature Time Code Transmitter Instructions, Apr. 2004, printed on Oct. 20, from http://www.web.archive.org/web/20040410225041/www.blackvideo.com/minature_tx.htm), 5 pages.

* cited by examiner

SYSTEMS AND METHODS FOR PROCESSING AND RECORDING AUDIO

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

BACKGROUND OF THE INVENTION

Embodiments of the present invention generally relate to improved systems and methods for processing and recording audio received from one or more wired or wireless devices.

Many systems and methods have been created to record performance audio. Some such systems include a multi-track audio recorder wired to one or more microphones or receiving wireless audio from one or more microphones. That is, one or more performers performing on a sound stage are recorded by one or more microphones that are directly wired to, or communicate wirelessly with, the multi-track recorder. In some such systems, the multi-track recorder combines the single track of audio received from each microphone to create one multi-track audio file. In many such systems, the received audio and/or the multi-track audio is timestamped with a time reference signal such as a Society of Motion Picture and Television Engineers ("SMPTE") timecode signal containing information regarding the hour, minute, second, frame, type of timecode (i.e., nondrop or drop frame), and user-definable information. Such information allows audio to be more easily matched and/or combined with simultaneously recorded video or other performance components.

In some such systems, a producer or other personnel indicates the current SMPTE timecode to the various parties involved in the performance recording via the use of an electronic slate upon which the current timecode is displayed. Many times, the timecode displayed on the slate is generated by a clock internal to the electronic slate. Or, the slate timecode may be obtained from another master timecode source. Also, prior to recording, many components of the performance recording system (e.g., video camera, audio recorder, optical display equipment, etc.) typically physically connect to the electronic slate in order to synchronize the component's timecode generator with that of the electronic slate. In such scenarios, slippage may sometimes occur as each component's timecode generator or clock may run at a slightly different rate.

Or, in some such systems involving the use of an electronic slate, the electronic slate is equipped with a clapper arm. In such an embodiment, the video camera films the timecode displayed by the electronic slate and the audio recorder records the sound of the clapper arm. This allows the editors to synchronize audio and video by coordinating the sound of the clapper arm as captured by the audio recorder(s) with the timecode displayed in the video(s) at the time the clapper arm was sounded.

Typically, the quality of audio recorded by an audio recording device is modified within the audio recorder. That is, a user of the audio recorder listens to the received audio and makes various adjustments to the audio recording circuitry to improve the quality thereof. One such adjustment is gain, or amplification, of the received audio. In some such systems, the change in gain or amplification of the audio is made by modifying one or more amplification circuits located in the audio recorder, and these adjustments may be made locally at the audio recorder via knobs, slides, and the like.

BRIEF SUMMARY OF THE INVENTION

Briefly stated, in one aspect of the present invention, a method of extending the dynamic range of a system analog-to-digital conversion system is provided. This method includes the steps of: receiving an analog signal; amplifying the analog signal via at least one amplifier; converting the analog signal amplified by a first of the at least one amplifiers into a first digital signal via a first analog-to-digital conversion system; converting the analog signal unamplified, or amplified via a second of the at least one amplifiers, into a second digital signal via a second analog-to-digital conversion system; receiving a first sample from the first digital signal; receiving a second sample from the second digital signal; applying a current calculated gain value to the first sample to create a calculated sample; outputting the calculated sample as an output; automatically switching the output from the calculated sample to the second sample if the calculated sample exceeds a first setpoint; activating a timer to countdown from a maximum value; and automatically switching the output from the second sample to the calculated sample upon the expiration of the timer.

In another aspect of the present invention, a system for recording a performance including an audio recorder with integral slate display is provided. The system includes: at least one video recorder; and at least one audio recorder, wherein the audio recorder is equipped with an ability to use the audio recorder display as a slate display upon command, the slate display displaying a timecode generated by the audio recorder timecode generator. The at least one audio recorder includes: an audio input port; an analog-to-digital conversion system; an audio recorder local control unit; an audio recorder timecode generator; an audio recorder display; an audio recorder user interface; and an audio recorder power supply.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments that are presently preferred. It should be understood, however, that the invention is not limited to the precise arrangements and instrumentalities shown. In the drawings.

DETAILED DESCRIPTION OF THE INVENTION

Figure 1:
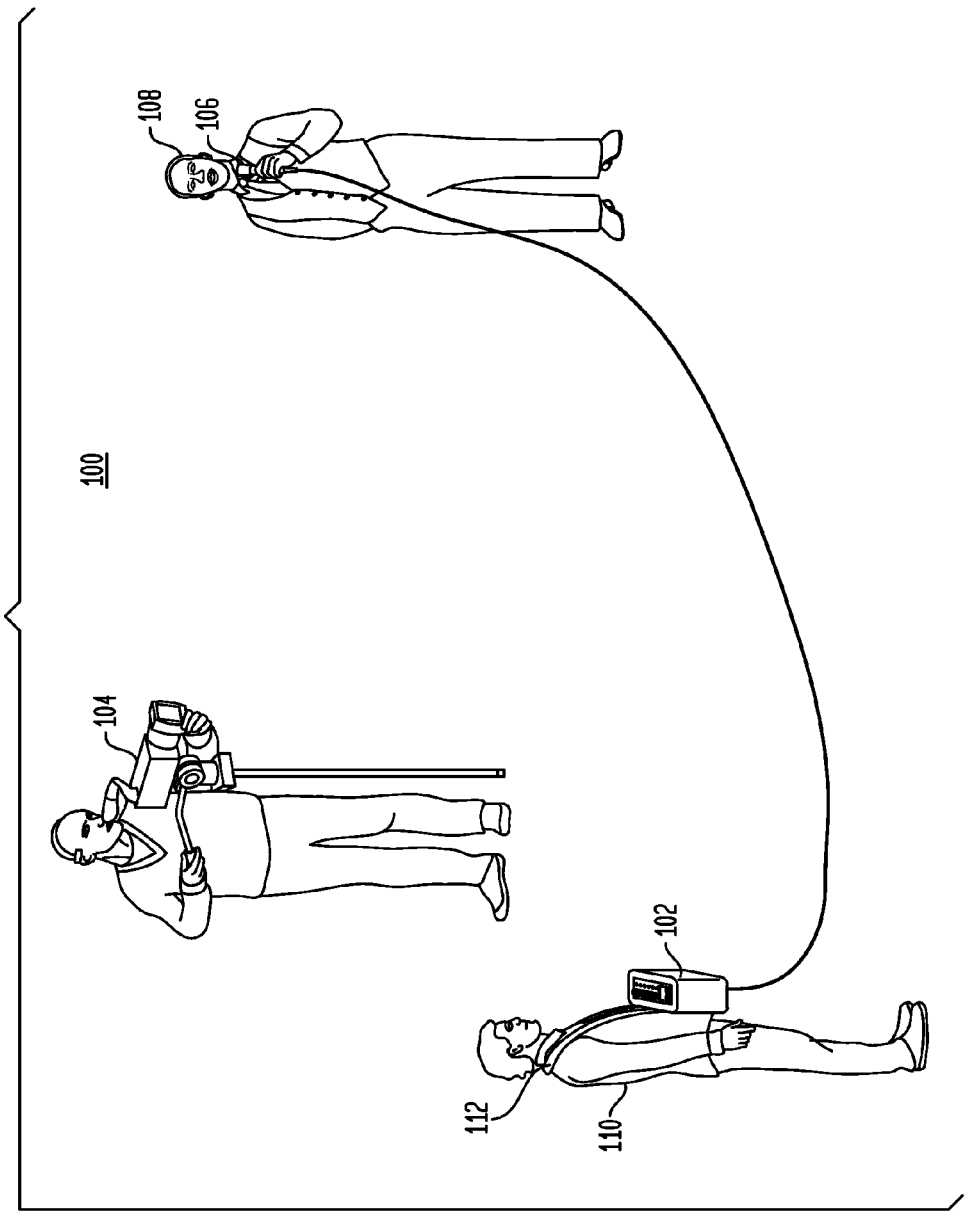
FIG. 1 depicts the components of a recording system in accordance with one embodiment of the present invention including, inter alia, an audio recorder, a video recorder, a performer, and an audio input device.

Referring first to FIG. 1, depicted is recording system 100 in accordance with one embodiment of the present invention. Recording system 100 records audio and video events, such as performances, movie takes, etc. having one or more performers.

In the embodiment of the present invention depicted in FIG. 1, recording system 100 includes audio recorder 102, video recorder 104, audio input device 106, performer 108, and sound engineer 110. Live audio transmitted by one or more audio input devices 106 is recorded by audio recorder 102. Optionally, video may be simultaneously recorded by video recorder 104. Although only one audio input device 106 and performer 108 are depicted in recording system 100 of FIG. 1, any number of audio input devices 106 and/or performers 108 may be substituted as audio recorder 106 may be equipped for multi-track recording.

Additionally, although system 100 is shown including wired audio input devices 106, wireless audio input devices may be substituted without departing from the scope of the present invention. In such a scenario, audio recorder 102 may be coupled to an audio receiver which receives the digital audio signals wirelessly and transmits them to an analog form for processing by audio recorder 102. In other embodiments of the present invention, an audio receiver and/or other components capable of converting the wirelessly received digital audio signals into analog form are integral to audio recorder 102.

Audio recorder 102 may be virtually any commercially available audio recorder intended for use in a system such as recording system 100. Audio recorder 102 receives audio from audio input device(s) 106 as typically generated by a performer 108 or the like. In the depicted system, audio recorder 102 is a Nomad™ Mixer/Recorder as manufactured by Zaxcom™, Inc., however, the systems and methods of the present invention may be implemented in virtually any commercially available, or yet to be created, audio recorder suitable for the intended purpose as described herein.

Video recorder 104 may be any commercially available video recorder capable of recording live video. For the purposes of the embodiment of the system depicted in FIG. 1, video recorder 104 merely needs the capability of recording the display of audio recorder 102 prior to recording performer 108 or the like. Additionally, although one video recorder 104 is shown, multiple video recorders 104 may be substituted. Audio input device 106 is discussed below in greater detail with respect to FIG. 2A.

Figure 2A:
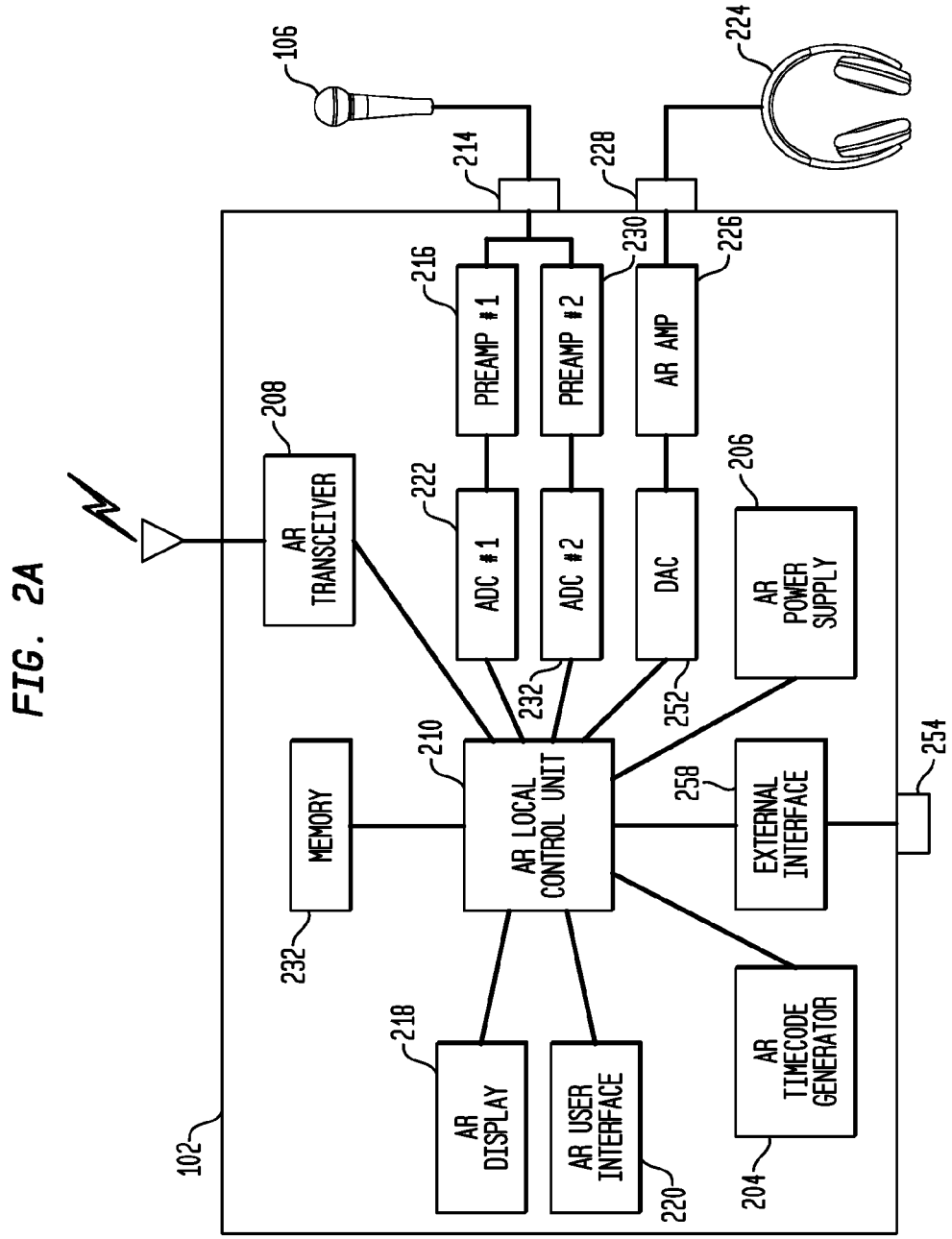
FIG. 2A depicts a block diagram of the internal components of an audio recorder in accordance with one embodiment of the present invention.

Turning next to FIG. 2A, depicted is a block diagram of one embodiment of audio recorder 102 for use with system 100. Such audio recorders may be manufactured in a form compatible with over-the-shoulder use, such as those typically worn by audio engineers, sound mixers, and the like. For example, in one embodiment of audio recorder 102, it is equipped with strap holders capable of holding audio recorder 102 via the shoulder(s) of a sound engineer or the like via a shoulder harness 112. However, the features of the present invention may be implemented in audio recorders that are not designed for over-the-shoulder use.

In this embodiment, audio recorder 102 includes, inter alia, timecode generator 204, AR power supply 206, AR transceiver 208, AR local control unit 210, AR audio input device port 214, AR preamp1 216, AR preamp 2 230, AR display 218, AR user interface 220, AR ADC1 222, AR ADC2 232, AR amp 226, AR audio output port 228, digital-to-analog converter 252, external interface 258, memory 232, and external interface port 254.

Although the embodiment depicted in FIG. 2A includes AR preamp2 230, alternate embodiments are envisioned in which AR preamp2 is excluded. Also, in the depicted embodiment of the present invention, AR preamp1 216 is initially set to have a gain value of 20 dB and AR preamp2 230 is set to have a gain value of 0 dB, however, alternate values may be substituted without departing from the scope hereof. The gain of AR preamp2 may be set to equal any value less than the value of AR preamp 1. Also, the gain setting of AR preamp1 216 may be manually adjusted by sound engineer 110 during use of audio recorder 102 via audio recorder user interface 220.

In the depicted embodiment, AR transceiver 208 is a Cypress CYRF6936 2.4 GHz transceiver, however, alternate transceivers may be substituted including, without limitation, a Micrel Semiconductor RadioWire® transceiver. Also, transceivers having varying frequencies may also be substituted. It should be noted that any combination of hardware and software may be substituted for any component described herein without departing from the scope of the present invention. Transceiver 208 allows audio recorder 102 to transmit and receive data including, without limitation, a master time reference signal, digital commands (e.g., remote control data), audio, and the like to and from other devices of the recording system including, without limitation, video recorder 104 and wireless microphones.

In one embodiment of the depicted recording systems, video recorder 104 is equipped with a transceiver capable of communicating with audio recorder 102. For example, video recorder 104 may receive monitor audio locally and transmit same digitally and wirelessly to audio recorder 102 to allow sound engineer 110 to confirm that the audio is being properly recorded at video recorder 104. In another exemplary use of transceiver 208, transceiver 208 allows the audio being recorded to be transmitted to others involved with the performance being recorded.

Figure 4:
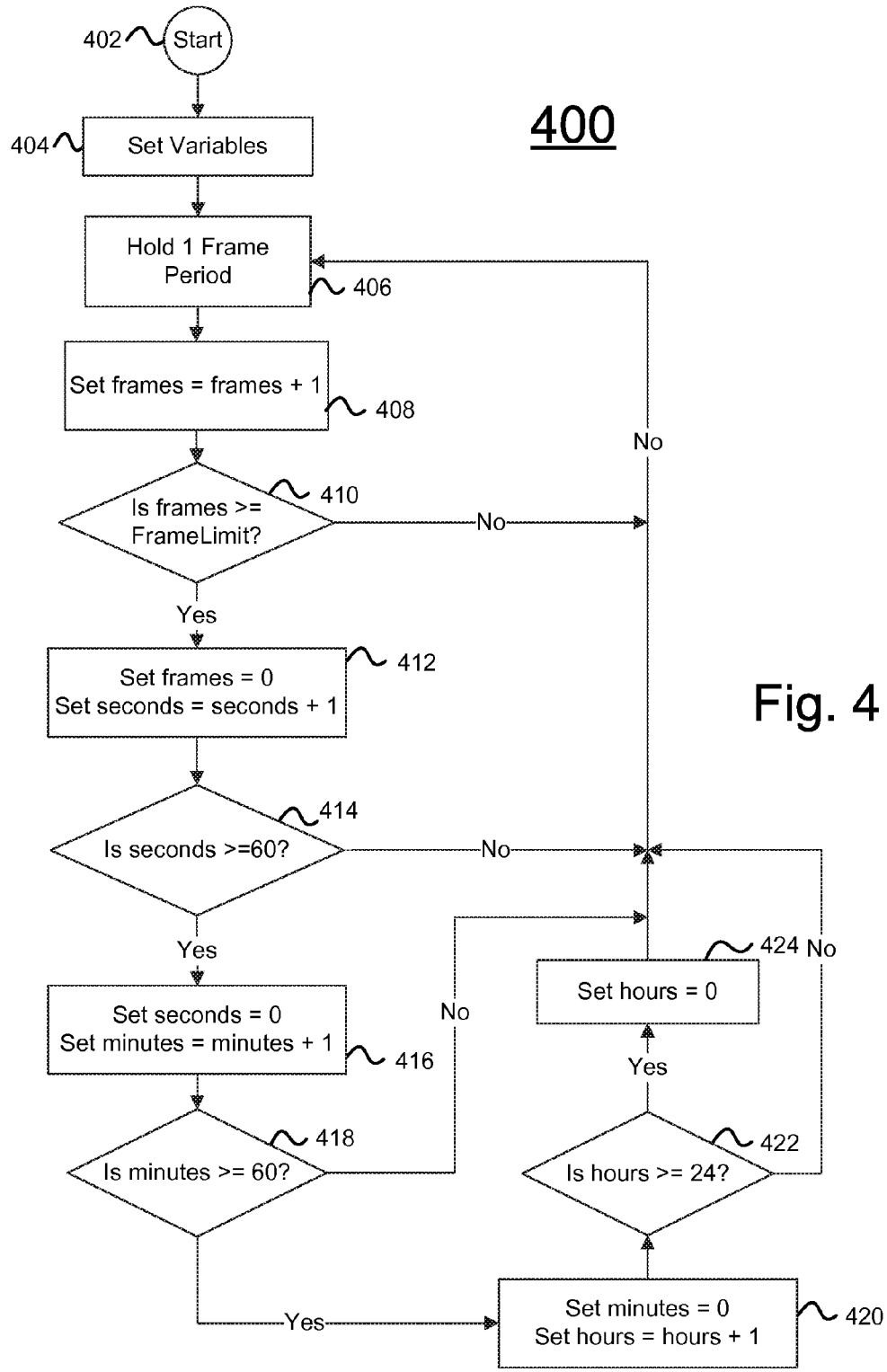
FIG. 4 depicts a process for generating a timecode via software in accordance with one embodiment of the present invention.

The block represented by AR Timecode Generator 204 may be implemented via hardware or software. For example, the master time reference signal may be generated by audio recorder 102 via a software process such as the one depicted in FIG. 4. Or, alternatively, timecode may be generated by dedicated hardware (e.g., a clock), a second local control unit, or the like. The master time reference signal may also be generated by an independent timecode generator that transmits timecodes to audio recorder 102 wirelessly or via a cable or the like connected from the independent timecode generator to a dedicated or multi-purpose external interface port 254. In the latter scenario, the timecodes received via timecode external interface port 254 may be optionally converted, buffered, and/or amplified prior to transmission to AR local control unit 210.

In one aspect of the present invention, the time reference signal generated by AR timecode generator 204 is an SMPTE timecode signal containing information regarding the hour, minute, second, frame, type of timecode (i.e., nondrop or drop frame), and user-definable information (e.g., the transport status of audio recorder 102, the name of a scene, the name of a take, an audio input device identifier that identifies the audio input device from which the respective audio was received, a track identifier that identifies the track of audio which may include the actor or actress recording the respective audio, etc.). This master time reference signal provides a time reference for all components of the recording system, which may use this information for a variety of purposes including, without limitation, synchronization of video and audio.

Audio recorder 102 receives audio from any compatible audio input device such as AR audio input device 106 or an audio receiver receiving audio from one or more wireless microphones via audio input device port 214. AR audio input device 106 may be any type of commercially available audio input device (e.g., a microphone or audio recorder) and audio input device port 214 may be any commercially available audio input device port that is compatible with AR audio input device 106 and the internal components of audio recorder 102. The received audio is then buffered and/or amplified by AR preamp1 216 and, optionally, AR preamp2 230 (i.e., only in embodiments of the present invention in which preamp2 is included). Then, the audio is converted from analog to digital by AR analog to digital converters ("ADCS") 222 and 232 such that the audio may be read in digital form by AR local control unit 210. In one embodiment of the present invention, ADC1 222, ADC2 230, and Digital to Analog Converter ("DAC") 252 (as discussed below) are implemented via an Asahi Kasei Microdevices ("AKM") 24-Bit 192 kHz Stereo Audio CODEC having model no. AK4621 (i.e., this device includes a two channel ADC and a DAC). AR preamp1 216 and/or AR preamp2 230 may be a New Japan Radio ("NJR") Ultra Low Noise Dual Operational Amplifier having model no. NJM2122M. However, these components are merely exemplary and others may be substituted without departing from the scope of the present invention.

Figure 3:
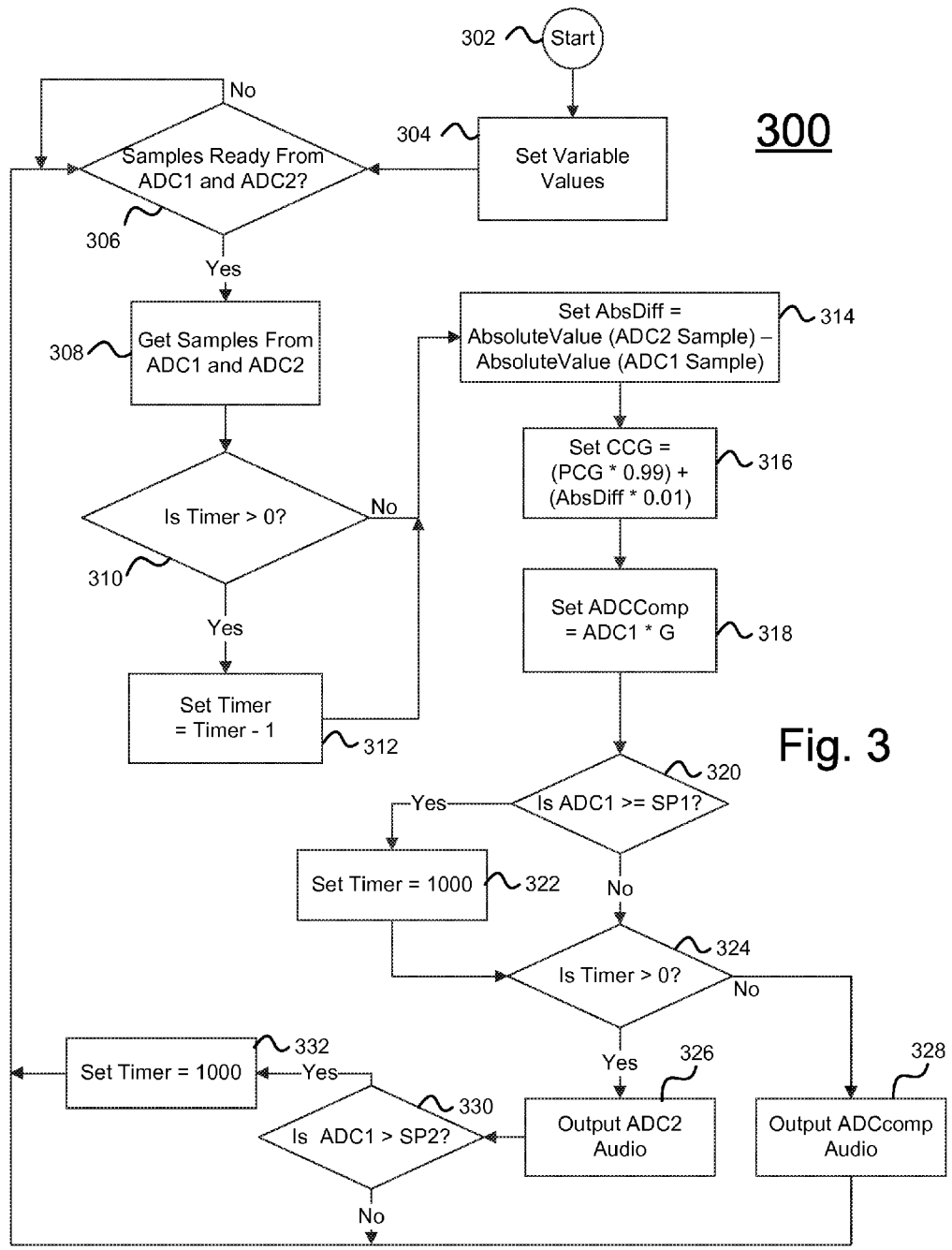
FIG. 3 depicts a process for extending the dynamic range of an analog-to-digital conversion system in accordance with one embodiment of the present invention.

Two ADCs and one or more pre-amplifiers are included in embodiments of the present invention that are equipped with the ability to automatically adjust the gain of outputted audio as discussed in greater detail below with respect to FIG. 3. However, alternate embodiments of the present invention are envisioned in which gain is not automatically adjusted. In such embodiments, only one ADC1 222 is required and the software implementing the process of FIG. 3 is not required. It should also be noted that the automatic gain adjustment hardware and software discussed herein are merely exemplary and any other compatible hardware or software capable of automatically adjusting gain in substantially the same manner may be substituted without departing from the scope of the present invention.

Audio recorder 102 transmits audio from AR local control unit 210 to any compatible audio output device such as AR audio output device 224 via audio output device port 228 after the audio is converted from digital to audio by DAC 252 (as also discussed above) and amplified by AR amp 226. In some embodiments of the present invention, AR amp 226 is a rail-to-rail quad BiCMOS operational amplifier having part no. TS924 and as manufactured by STMicroelectronics, however, other amplifiers may be substituted without departing from the scope hereof.

AR audio output device 224 may be any type of commercially available audio output device such as an earpiece, headphones, or the like and audio output device port 228 may be any commercially available audio output device port that is compatible with AR audio output device 224 and the internal components of audio recorder 102. In an alternate embodiment, digitally processed audio is converted to analog form via a digital-to-analog ("DAC") internal to AR local control unit 210 via an on-chip DAC. This analog audio is then amplified via AR amp 226 prior to transmission through audio output device port 228 to audio output device 224. In some embodiments of the present invention, AR local control unit 210 may be a digital signal processor such as Texas Instruments part number TMS320C6713. However, the present invention is not so limited. Any combination of hardware and software capable of performing substantially the same function may be substituted for any component described herein without departing from the scope of the present invention. For example, AR local control unit 210 may be eliminated and all of its functions may be implemented via hardware without departing from the scope hereof.

Figure 2B:
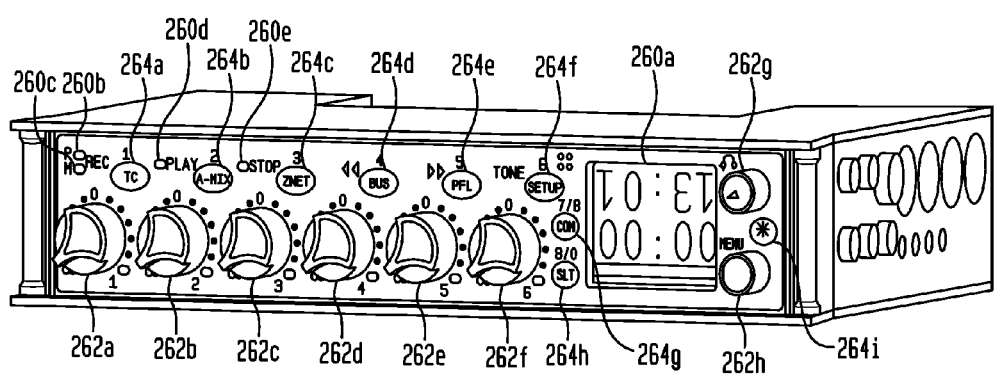
FIG. 2B depicts an external, front view of an audio recorder in accordance with one embodiment of the present invention.

AR recorder 102 also includes AR display 260 as depicted in the front view of FIG. 2B. As shown, AR display 260 includes one main substantially rectangular display 260a as well as a plurality of lamp type indicators 260b-260e. AR display 260a may be a small liquid crystal display ("LCD") module such as that manufactured by Crystal Clear Technologies and having part no. T220176C06WR00, or as manufactured by Optrex Corp. and having part no. T-51750GD065J-FW-AA, or the like. AR displays 260b through 260e may be light emitting diodes ("LEDs"). However, alternate components for AR display 260 and 260b-260e may be substituted. Embodiments of recording systems such as system 100 are envisioned in which AR displays 260a and/or 260b-260e are eliminated, as applicable, without departing from the scope hereof.

User interface 262 includes a plurality of adjustable inputs 262a through 262h as well as a plurality of two position inputs 264a through 264i. In one embodiment, adjustable inputs 262a through 262h may be any device capable of providing an analog input to AR local control unit 210 such as Incremental Type Encoders as manufactured by Alps® and having part no. ECO9E1524405. However, alternate devices may be substituted.

Two position inputs 264a through 264i may be any device capable of providing a two position input to AR local control unit 210 such as push-button type potentiometers. However, alternate devices may be substituted.

Adjustable inputs 262 and two position inputs 264 allow a user to perform local AR functions including, but not limited to, audio input gain adjustment, menu functions, recording functions, playback functions, setup functions, and the like.

Additionally, audio recorder 102 may include any one of a variety of commercially available batteries to function with the power supply 206 without departing from the scope of the present invention. Power supply 206 may be virtually any power component or combination thereof that is compatible with the other components of audio recorder 102 including, but not limited to, a Linear Technology LTC3728 Dual Synchronous Stepdown Switching Regulator. Memory 232 of audio recorder 102 stores data utilized by audio recorder 102 and the processes thereof. For example, memory 232 may locally store audio processed by AR local control unit 210 in one or more audio files. In one aspect of the present invention, local control unit 210 receives recordable audio from audio input devices 106, which may be worn by performer 108 and connect to audio recorder 102 at one or more local audio input device port(s) 214. The locally stored audio files may include timestamps (e.g., timestamps may be stored in the header of the audio file) that indicate when, during the audio event, each segment of audio occurred. The timestamps may be generated based upon timecodes created by timecode generator 204 or based upon timecodes received via AR transceiver 208 or an external interface port 254 or the like.

In another exemplary embodiment, memory 232 may also store calculated gain values including, without limitation, those calculated by a process such as process 300, particularly since the previously calculated value is utilized when the gain value is calculated.

Memory 232 may be virtually any type of commercially available removable or non-removable memory including, but not limited to, flash memory cards, compact flash memory cards, Universal Serial Bus ("USB") thumbdisks, and the like. Although one external interface port 254 and external interface 258 is shown in FIG. 2A, these blocks are exemplary and any quantity of external interface port(s) 254 and/or external interface(s) 258 may be substituted or such components may be omitted without departing from the scope of the present invention. External interface port(s) 254 may be virtually any port(s) capable of receiving data and/or signals from a device external to audio recorder 102. For example, external interface port 254 may be, without limitation, an RS-485/RS-422 port, a USB port, or combinations thereof without departing from the scope hereof. Any signals received via external interface port(s) 254 are processed by external interface 258 to transform the received signal into once capable of being processed, or in a better form for being processed by, AR local control unit 210. For example, if external interface port 254 is an RS-485/RS-422 port, then external interface 258 may be a RS-485/RS422 transceiver such as part no. MAX3486 as manufactured by Maxim. However, this is merely exemplary and other ports and interfaces may be substituted or added without departing from the scope hereof.

In some embodiments of the present invention, external interface port(s) may be utilized to direct AR local control unit 210 to set the starting value of the timecode generator 204 (e.g., timecode generation software) to a starting value other than zero. For example, in the exemplary timecode generation flowchart of FIG. 4, the TimecodeHour, TimecodeMinute, TimecodeSecond, and/or TimecodeFrame variables may be set to a value other than zero and such value may be received via external interface port(s) 254 from an external timecode generator or the like. Such timecodes may also be received wirelessly via AR transceiver 208. However, any type of data or signals may be received via external interface port(s) 254 without departing from the scope hereof.

In another exemplary embodiment, external interface port(s) 254 include dedicated timecode input and/or timecode output ports. When the former port is included, audio recorder 102 may simply receive the timecode from an external generator, thereby eliminating the need to create the timecode locally via a process such as that depicted in FIG. 4. When the latter port is included, whether the timecode is received from and external device or generated locally, audio recorder 102 has the ability to transmit the current timecode to external devices via the timecode output external interface port 254. Such a port may be utilized, for example, in a process such as process 500 during which the slate display is displayed via the audio recorder display 218 and the other components of the recording system may plug into a timecode output external interface port 254 to synchronize their internal timecodes to that of audio recorder 102.

Although many specific features and functions for audio recorder 102 have been delineated herein, other features and functions may be added or eliminated without departing from the scope of the present invention.

Referring now to FIG. 3, illustrated is a flow diagram of one process for extending the dynamic range of a system's analog-to-digital conversion system in accordance with one embodiment of the present invention. That is, it is typical for a received analog signal to exceed the dynamic range of the analog-to-digital conversion system responsible for digitizing the analog waveform produced by the source of the analog signal (for example, a microphone or other audio input device). Although this process is described in conjunction with recording system 100 and audio recorder 102, process 300 may be included in virtually any analog-to-digital conversion system regardless of its application. For example, process 300 may be implemented in conjunction with a cell phone at the point that analog audio is received to better handle users who, for example, yell into a cell phone. Additionally, although process 300 is depicted with two ADCs, ADC quantities greater than two may be substituted without departing from the scope hereof.

Process 300 begins at 302. Process 300 may be executed by a local control unit such as AR local control unit 210 as described above with reference to FIG. 2A. For example, at 302, one or more performers are equipped with audio input devices (e.g., audio input devices 106) that are coupled to an audio recorder, such as audio recorder 102 as described above with respect to FIGS. 1, 2A, and 2B. Also, a sound engineer or other personnel may be equipped with an audio recorder such as audio recorder 102. Additionally, at 302, it is important to note that a sound engineer may have manually adjusted the gain of preamp1 216 via user interface 220, for example, via an adjustable input 262. Further, the sound engineer has the ability to adjust the gain of preamp1 216 at any point during use of audio recorder 102, and therefore, at any point during operation of process 300. Process 302 then proceeds to 304.

At 304, the values of the process variables are set. In the depicted embodiment, process 300 includes five variables, namely, the Timer, CurrentlyCalculatedGain ("CCG"), PreviouslyCalculatedGain "PCG"), SP1, and SP2 variables. In the depicted embodiment, the Timer variable is initially set to zero and the CCG and PCG variables are set to 0 dB. In one exemplary embodiment, the value of the SP1 variable is calculated by subtracting 3 dB from the clipping value of ADC1 (i.e., the value at which sample measurements exceeding the upper limit of the bit-depth range of the ADC are reduced to the highest available value), and the value of the SP2 variable is calculated by subtracting 6 dB from the clipping value of ADC1. However, varying quantities of variables and alternate variable values may be substituted without departing from the scope hereof. The difference between the values of the SP1 and SP2 variables provides a level of hysteresis to prevent constant switching between the outputting of ADCComp audio and ADC2 audio, which would likely cause distortion due to uncompensated differences between the two preamplifier circuits.

Next, at 306, process 300 determines whether samples are ready for the digital signals created by both ADC1 and ADC2. In the depicted embodiment, the analog-to-digital conversion system utilized to create a first digital signal from the received audio is ADC1 and the analog-to-digital conversion system utilized to create the second digital signal from the received audio is ADC2, however, other analog-to-digital conversion systems may be substituted without departing from the scope of the present invention. If no samples are ready, or if only one of the two samples are ready, process 300 repeats step 306 until both samples are ready. If/when both samples are ready, process 300 proceeds to 308, at which one sample is read from each ADC.

When process 300 is utilized with the exemplary hardware depicted in FIG. 2A, the samples received from ADC1 have passed through a preamplifier circuit Preamp 1 216 having an exemplary initial gain of approximately 20 dB, which Preamp1 gain may be manually adjusted by a user at any time. However, other low noise microphone preamplifier buffer circuits having fixed or slowly variable gains may be substituted. Also, when process 300 is utilized with the exemplary hardware depicted in FIG. 2A, the samples received from ADC2 have passed through a preamplifier circuit having an exemplary fixed gain of approximately 0 dB, however, other embodiments are envisioned in which samples are received from ADC2 directly (i.e., without a preamplifier), through an attenuation circuit (e.g., a preamplifier having a gain of approximately −10 dB), or through a preamplifier having a minimal gain (i.e., a gain lesser than that of ADC1's preamplifier) including, without limitation, +10 dB. However, other preamplifier gains for preamp1 and/or preamp2 may be substituted without departing from the scope hereof.

Next, at 310, the value of the Timer variable is queried to determine if it is greater than zero. If yes, the value of the Timer variable is decremented by one at 312 and process 300 proceeds to 314. If the value of the Timer variable is not greater than zero, process 300 proceeds directly from 310 to 314. The value of the Timer variable will be greater than zero whenever the value of the signal received from ADC1 exceeds or equals the value of the SP1 variable, thereby causing process 300 to output the ADC2 audio rather than the ADCComp audio. Process 300 will not switch back to the ADCComp audio until the value of the Timer variable returns to zero through continuous iterations of step 312. A maximum value of the Timer variable (i.e., the value to which the Timer variable is set initially) is approximately 1000, which, when decremented to zero as shown in process 300, results in a time period equal to approximately 10 milliseconds. However, other time periods may be substituted.

At 314, a sample difference is calculated (i.e., the difference between the two samples). In the exemplary embodiment shown in FIG. 3, the sample difference is represented by the AbsDiff variable, and it is calculated by subtracting the absolute value of the sample received from ADC1 from the absolute value of the sample received from ADC2. Next, at 316, the value of the CCG variable is calculated via the following Equation 1:

$$CCG=(PCG*0.99)+(AbsDiff*0.01) \qquad \text{EQ1}$$

wherein the value of the PCG variable is equal to the value of the CCG variable created in the previous iteration of step 316 and as stored in a memory such as memory 232, RAM, or the like. That is, the value of the CCG variable is set to equal the sum of: 1) the value of the PCG variable multiplied by 0.99; and 2) the value of the AbsDiff variable multiplied by 0.01. Use of the PCG value in equation 1 causes the change in the value of the CCG variable to change slowly during each successive iteration of step 316, which respectively causes the ADCComp audio output at step 328 to also change slowly resulting in a smooth audio output. However, varying equations can be substituted including, without limitation, other commonly known low pass filter equations.

Since the exact gain of the two preamplifier circuits preamp1 and preamp2 is not known (e.g., due to analog component variations such as temperature and the like), process 300 compares samples of the digital signals created by ADC1 and ADC2 in order to calculate the difference in gain between the two preamplifier circuits. In process 300, the difference between the absolute values of these digitized audio signals is utilized to compute the gain difference. However, other methods including, but not limited to, peak detection and power detection may be substituted without departing from the scope hereof.

Although process 300 is depicted as continuously calculating and updating the value of the CCG variable, alternate embodiments are envisioned in which the value of the CCG is static and is determined during a calibration procedure. In such an embodiment, the value of the CCG is a fixed value. An exemplary calibration process is a one time execution of process 300 from step 302 through step 316 in order to calculate the fixed value of CCG to be used until the audio recorder is recalibrated.

The calculation of the value of the CCG variable is designed to keep the potential outgoing analog signals, namely, ADC2 and ADCComp at substantially the same amplitude to avoid or minimize degrading the quality of the output audio particularly when it is switched from ADC2 to ADCComp and vice-versa.

Next, at 318, the value of the ADCComp sample is calculated by multiplying the value of the ADC1 sample by the value of the CCG variable. That is, once the value of the CCG variable is known, process 300 can multiply the signal received from ADC1 by this value to force the amplitude of the calculated outgoing audio signal to match the amplitude of the ADC2 signal.

Process 300 then proceeds to 320 at which it is determined whether the value of the ADC1 sample is greater than or equal to the value of the SP1 variable. That is, process 300 monitors the signal received from ADC1 to determine if it has exceeded a pre-determined setpoint. If yes, the value of the Timer variable is set to equal a maximum value of one thousand at step 322 and process 300 proceeds to 324. If the answer at 320 is no, process 300 proceeds directly from 320 to 324.

At 324, process 300 determines whether the value of the Timer variable is greater than zero. If no, process 300 proceeds to 328, at which the ADCComp audio sample calculated at step 318 is output to an outgoing audio circuit (e.g., the exemplary circuit consisting of DAC 252, AR amp 226, audio output device port 228 and audio output device 224 as depicted in FIG. 2A) and process 300 returns to 306. Alternatively, the ADCComp audio sample may be processed by a compressor/limiter algorithm executed by AR local control unit 210 or another device prior to being output to an outgoing audio circuit. The compressor/limiter algorithm would reduce the gain of the outgoing signal in order to minimize clipping distortion and to allow the signal to be processed by other algorithms or DACs that typically have the same clipping threshold as ADC1.

If, at 324, the value of the Timer variable is not greater than zero, process 300 proceeds to 326, at which the ADC2 audio sample is output to an outgoing audio circuit. That is, the outgoing audio is switched to use the sample received from ADC2 rather than the calculated ADCComp sample. Since the gain difference between the two circuits is known, the outgoing audio signal suffers minimal degradation during the switchover. The switchover may be instantaneous (as shown in FIG. 3) or it may be cross-faded over a period of time to reduce the effects of distortion due to inaccuracies in the calculation of the CCG variable. It should be noted that, depending upon specific system design, some systems may not require cross-fading to improve the quality of the output audio. Process 300 then proceeds to step 330.

At 330, it is determined whether the value of the ADC1 sample is greater than the value of the SP2 variable. If yes, the maximum value of the Timer variable is set to equal approximately one thousand at step 332 and process 300 returns to step 306. If no, process 300 returns directly from 330 to 306.

Process 300 raises the noise floor of the audio signal by approximately 20 dB at the point at which the audio signal requires switching from the ADCComp to ADC2 signal (assuming that both ADCs have the same signal to noise ratio). This noise floor difference is typically undetectable by the human ear since the large audio signal that caused process 300 to switch to ADC2 masks the change in the noise floor.

As noted above, a user of audio recorder 102 may manually adjust the gain of preamp1 216 at any point in the process of 300 (and independent of process 300). Although the value of the CCG variable will vary from the manually adjusted value of preamp1 216 immediately after the adjustment occurs, process 300 is designed to allow the value of the CCG to readjust through successive iterations of process 300 until it is approximately equal to the value of preamp1 216. In this manner, process 300 automatically calibrates itself to enhance the dynamic range of the audio recorders analog-to-digital conversion system.

In another exemplary embodiment of process 300, process 300 may be implemented in conjunction with a wireless microphone at the point that analog audio is received. Once such wireless microphone is shown in U.S. Pat. No. 7,711, 443 ("the '443 patent"), which is hereby incorporated by reference. In the '443 patent, FIG. 3A is a block diagram of the internal components of a local audio device that operates as a wireless microphone. To implement process 300, local preamp 316, local ADC 322, and local control unit 310 would be utilized to perform the same functions as audio recorder components Preamp1 216, ADC1 222, and AR local control unit 210, respectively (in addition to the other functions of the wireless microphone) and an ADC2 and, optionally, a Preamp2, would be added to the FIG. 3A circuitry in the same manner in which it is configured for audio recorder 102. Process 300 may be executed by local control unit 310. In this manner, process 300 may be utilized to extend the dynamic range of the analog-to-digital conversion system of the wireless microphone.

It should be noted that although FIG. 3 has been described in conjunction with the processing of an audio signal, the method of FIG. 3 may be utilized in conjunction with any type of analog signal received from any type of sensor without departing from the scope hereof.

Process 400 depicts one method of generating a timecode to be utilized for synchronization of audio and video. Although this process is described with reference to recording system 100 in FIG. 1, process 400 may be included in virtually any system in which audio and video are recorded. Process 400 begins at 402. Process 400 may be executed by a local control unit such as AR local control unit 210 as described above with reference to FIG. 2A. For example, at 402, one or more sound engineers are equipped with respective audio recorders, such as audio recorder 102 as described above with respect to FIGS. 1, 2A, and 2B. In the exemplary embodiment, audio recorder 102 is equipped to be worn over a shoulder. Process 402 then proceeds to 404.

Next, at 404, the values of the process variables are set. In the depicted embodiment, process 400 includes four timecode variables and one FrameLimit variable. At 404, each of the timecode parameters, namely, the TimecodeHour, TimecodeMinute, TimecodeSecond, and TimecodeFrame values of the timecode are initially set to equal zero. The FrameLimit variable is initially set to equal the value of the frame rate (i.e., in this case 33.3 frames per second), however, other values may be substituted including, without limitation, standard television and film SMPTE frame rates of 23.98, 24, 25, and 29.97. However, varying quantities of variables and alternate variable values may be substituted without departing from the scope hereof. Also, process 400 incorporates an SMPTE timecode, however, alternate timecode formats may be substituted. Further, at 404, the starting value for the timecode may be other than zero. For example, the starting value may be entered manually by a user (e.g., via a user interface such as AR user interface 220 or may be received from an external device (e.g., via an external interface port 254 or the like).

Next, process 400 holds at step 406 for the time equivalent to one frame period. Then, at 408, process 400 increments the value of the Frames variable by one, and it proceeds to 410. At 410, process 400 determines whether the value of the Frames variable is greater than or equal to the value of the FrameLimit variable. If no, process 400 returns to 406. If yes, process 400 proceeds to 412.

At 412, the value of the Frames variable is reset to zero and the value of the TimecodeSecond variable is incremented by one. Process 400 then proceeds to 414, at which process 400 determines whether the value of the TimecodeSecond variable is greater than or equal to sixty. If no, process 400 returns to 406. If yes, process 400 proceeds to 416.

At 416, the value of the TimecodeSecond variable is reset to zero and the value of the TimecodeMinute variable is incremented by one. Process 400 then proceeds to 418, at which process 400 determines whether the value of the TimecodeMinute variable is greater than or equal to sixty. If no, process 400 returns to 406. If yes, process 400 proceeds to 420.

At 420, the value of the TimecodeMinute variable is reset to zero and the value of the TimecodeHour variable is incremented by one, and process 400 proceeds to 422. At 422, process 400 determines whether the value of the TimecodeHour variable is greater than or equal to twenty four. If no, process 400 returns to 406. If yes, process 400 proceeds to 424, at which the value of the TimecodeHour variable is reset to zero, and process 400 returns to 406.

Figure 5:
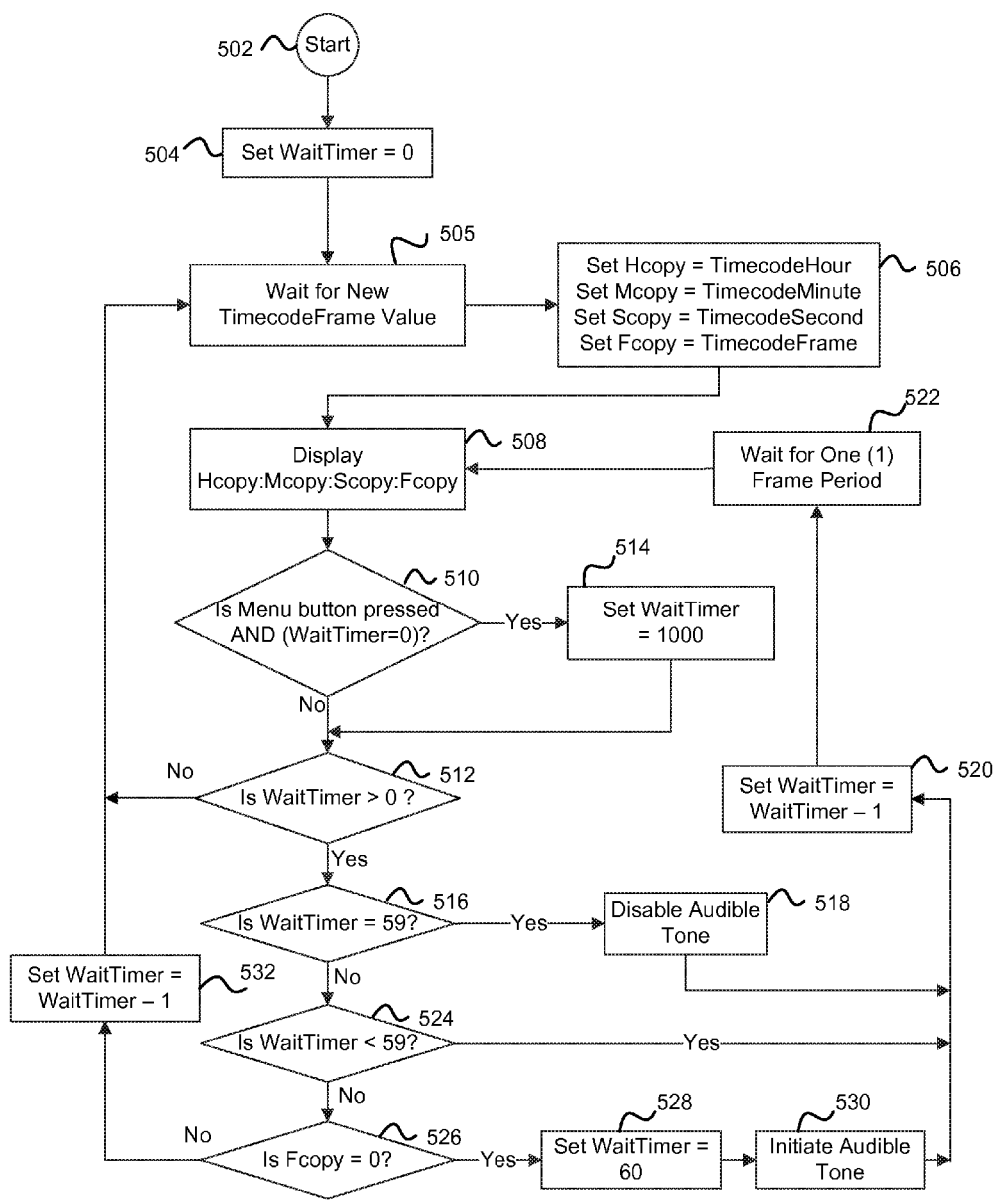
FIG. 5 depicts a process for displaying an electronic slate display utilizing the audio recorder's integral display in accordance with one embodiment of the present invention.

In the manner described above, process 400 generates an ongoing, continually updating timecode for use in, inter alia, audio and video synchronization and for use, without limitation, with processes such as process 500 of FIG. 5.

Referring now to FIG. 5, depicted is a process for displaying an electronic slate display in accordance with one embodiment of the present invention, thereby facilitating synchronization of audio and video during the editing process. That is, this process will create an audible sound and freeze the electronic slate display for a period of time to allow the other recording devices to synchronize their current timecode with that of the audio recorder, which is taking the place of the electronic slate and thereby rendering it unnecessary. Process 500 begins at 502, at which, for example, audio recorder 102 is energized.

Next, at 504, the value of the WaitTimer variable is set to equal a value of zero. Process 500 then proceeds to 505, at which process 500 waits until a new TimecodeFrame value is received. Once it has been received, process 500 proceeds to 506. Step 505 acts to synchronize process 500 to when the timecode data is received from a process such as process 400. At 506, the values of variables Hcopy, Mcopy, Scopy, and Fcopy are set to equal the current values of the TimecodeHour, TimecodeMinute, TimecodeSecond, and TimecodeFrame variables, respectively, as determined by a process such as process 400. However, alternate methods of setting the timecode values may be substituted without departing from the scope hereof, and alternate methods of calculating the timecode may also be substituted.

Next, at 508, the values of the TimecodeHour, TimecodeMinute, TimecodeSecond, and TimecodeFrame variables are displayed on a display. For example, as depicted in FIG. 2B, the values of the TimecodeHour, TimecodeMinute, TimecodeSecond, and TimecodeFrame variables may be displayed as shown on a display such as substantially rectangular display 218a. In this particular example, each of the values of the TimecodeHour, TimecodeMinute, TimecodeSecond, and TimecodeFrame variables is preceded by a superscript H, M, S, and F, respectively, to indicate which portion of the timecode is being displayed. However, other displays and/or methods of displaying the timecode may be substituted without departing from the scope hereof.

In one alternate embodiment, the font of the displayed timecode is increased as compared to text depicted in non-timecode displays. For example, the font size may be increased from approximately 2 millimeters high for standard displays to approximately 14 mm high when the timecode is displayed. However, varying font sizes may be substituted.

Process 500 then proceeds to 510, at which it is determined whether the "MENU" button located on a user interface (for example, AR user interface 220 as depicted in FIGS. 2A and 2B) has been pressed and whether the value of the WaitTimer is equal to zero. If either condition is not met, process 500 proceeds to 512, at which it determines whether the value of the WaitTimer variable is greater than zero. It should be noted that methods of activating the features of process 500 other than a physical button may be substituted without departing from the scope of the present invention.

At 512, if the value of the WaitTimer variable is not greater than zero, then the feature of process 500 has not been activated and the timecode is starting a new frame. Therefore, process 500 returns to 505 and 506 at which it eventually updates the displayed timecode values. In this manner, the current timecode value is continually displayed and updated on a display of the audio recorder for viewing by all parties involved in the audio and/or video recording process.

At 512, the value of the WaitTimer variable will be greater than zero only if the Slate Display feature has been activated by a button press or the like at 510. If this feature is activated at 510, process 500 then proceeds to 514. At 514, the value of the WaitTimer variable is set to equal a maximum value of approximately one thousand, and process 500 proceeds to 512. At 512 (when reached from step 514), the value of the WaitTimer variable is greater than zero and process 500 proceeds to 516.

At 516, the value of the WaitTimer variable is queried to determine if it is equal to fifty nine. If yes, as described in detail below, then the audible tone has been sounded for approximately 30 milliseconds and process 500 proceeds to 518, at which the audible tone is disabled. Process 500 then proceeds to 520, at which the value of the WaitTimer variable is decremented by one. Process 500 then proceeds to 522, at which process 500 is halted for approximately one frame period. In an embodiment of the present invention in which the frame rate is 33.3 frames per second, this delay allows one click of the WaitTimer to equate to approximately 30 milliseconds, thereby allowing a timing of the audible tone and/or display freeze to be controlled and/or lengthened. Similarly, sixty clicks of the WaitTimer are equal to approximately 2 seconds (i.e., the intended period of the display freeze). However, alternate frame rates and/or tone and freeze durations may be substituted without departing from the scope hereof.

If, at 516, the value of the WaitTimer variable does not equal fifty nine, process 500 proceeds to 524, at which the value of the WaitTimer variable is queried to determine if it is less than fifty nine. If yes, as described in detail below, the screen is frozen, the audible tone has been disabled, and process 500 returns to 520. If no, the audible tone has not yet been sounded and the display has not yet been frozen and process 500 proceeds to 526.

At 526, process 500 determines whether the value of the Fcopy variable is equal to zero. If it is not, process 500 proceeds to 532, at which the value of the WaitTimer variable is decremented by one. Process 500 then returns to 505 and repeats until the value of the Fcopy variable is equal to zero.

That is, after the Menu button has been pressed, process 500 waits for the value of the Fcopy variable to be zero before utilizing audio recorder display 218 as an electronic slate display. Freezing the display at a frame value of zero facilitates synchronization of audio recorder 102 with the other components of the recording system since such other components may operate at different frame rates than audio recorder 102.

However, alternate embodiments are envisioned in which the value of the Fcopy variable does not have to equal zero in order to implement the Menu button synchronization feature. For example, in an alternate embodiment, the electronic slate display is displayed immediately following sensing of a button press or the like to initiate same. In such an embodiment, step 526 is eliminated.

When, at 526, the value of the Fcopy variable is equal to zero, process 500 proceeds to 528, at which the value of the WaitTimer variable is set to equal 60 (or approximately two seconds as discussed above). Process 500 then proceeds to 530, at which an audible 1 KHz tone is initiated. In the depicted embodiment and as discussed above, the audible tone will last for a duration of approximately 30 milliseconds. However, alternate tone frequencies and durations and alternate freeze time periods may be substituted without departing from the scope hereof. Also, the audible tone may be omitted without departing from the scope hereof.

The display associated with process 500 eliminates the need for an electronic slate, and the generation of the audible tone eliminates the need for the clapper arm often included with the electronic slate. That is, when audio recorder 102 is utilized as an electronic slate via process 500, the video recorders of system 100 film the timecode displayed by audio recorder 102 and the audio recorder and/or other components of system 100 record the sound of the audible tone generated by audio recorder 102. When audio recorder is located on the chest of the user, video recorder 104 is pointed downward to video the face of audio recorder 102, which is oriented at the top of audio recorder 102. This allows the editors of the various recordings to synchronize audio and video by coordinating the sound of the tone as captured by the audio recorder or other components with the timecode displayed in the video at the time the tone was sounded. In this manner, the systems and methods incorporating process 500 and the like eliminate the need for an electronic slate.

In addition to eliminating the need for an electronic slate, processes such as process 500 improve recording quality because it eliminates the need to synchronize the audio recorder timecode to an electronic slate timecode, thereby eliminating any slippage between the two. That is, since the audio recorder timecode generator now generates the timecode used by the audio recorder slate display and the audio recorder, slippage cannot exist because the number of timecode generators has been reduced from two to one. Also, the other components of the recording system (e.g., video camera, audio recorder, optical display equipment, etc.) may now physically connect to the audio recorder, rather than a separate electronic slate, in order to synchronize the component's timecode generator with that of the master time reference signal provided by the audio recorder. However, alternate embodiments are envisioned in which the audio recorder does not provide the master time reference signal.

Process 500 then returns to 520. Process 500 then repeats steps 520, 522, 508, 510, 512, 516, and 518, thereby disabling the audio tone at 518 after one click of the WaitTimer as discussed above. Process 500 then repeats steps 520, 522, 508, 510, 512, 516, and 524 until the value of the WaitTimer variable is reduced to zero, thereby ending the display freeze period. It should be noted that although the displayed timecode is frozen, the timecode generator continues to run (i.e., the timecode generator is not paused while the display is frozen). Process 500 then returns to 508 at which the current timecode value is displayed. Process 500 then repeats steps 510 and 512 and returns to 506 at which the values of the timecode are set to equal those of the current timecode generator such as the generator depicted in FIG. 4.

Figure 6:
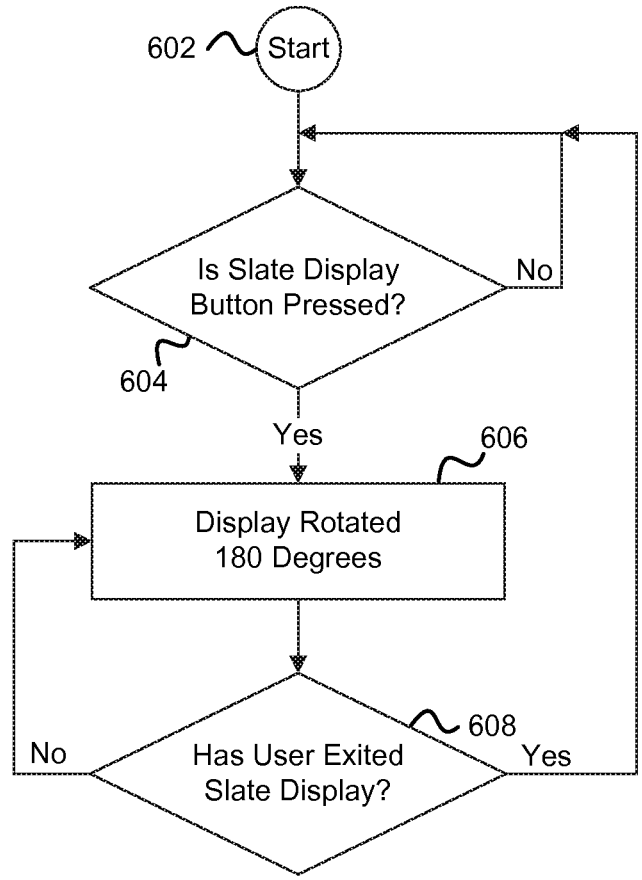
FIG. 6 depicts a process for inverting an electronic slate display in accordance with one embodiment of the present invention.

Referring now to FIG. 6, depicted is a process for inverting an electronic slate display in accordance with one embodiment of the present invention, particularly in accordance with embodiments of the present invention that include over-the-shoulder style audio recorders or other worn forms of audio recorders that are worn on the chest of the user such that the display of the audio recorder is visible when the sound engineers looks down at the audio recorder. Although not required to implement the process shown in FIG. 5, FIG. 6 may be run simultaneously with FIG. 5 to facilitate filming of the electronic slate display produced by audio recorder 102, and later reading thereof during the editing process. That is, since audio recorder 102 may be worn on the chest of the sound engineer, it may cause the electronic slate display to appear upside down when viewed by the other components of the recording system. That is, when a video camera records the display, it would appear upside down to the video camera as the video camera is located in front of the sound engineer pointing downward but on the opposite side of the audio recorder. Therefore, inversion of the display allows the other components to record the electronic slate display in its upright position. This allows video editors to later easily read the timecode and synchronize the video to other aspects of the performance including, without limitation, audio. When the video camera has completed its recording, the display is returned to its upright position to allow it to be easily read by the sound engineer. However, other displays and/or methods of displaying the timecode may be substituted without departing from the scope hereof.

Process 600 begins at 602, at which, for example, audio recorder 102 is energized. Process 600 then proceeds to 604, at which it determines whether a Slate Display or similar button has been pressed. One such exemplary button is SLT button 222h as depicted in FIG. 2B. If no, process 600 repeats 604. It should be noted that methods of activating the Slate Display feature of process 600 other than a physical button may be substituted without departing from the scope of the present invention.

If the Slate Display button has been pressed, process 600 proceeds to 606 at which the display of the audio recorder is inverted (i.e., rotated by one hundred and eighty degrees). Optionally, at 606, the font of the displayed text may also be increased for better visibility by video camera 104. For example, the font size may be increased from approximately 2 millimeters high for standard displays to approximately 14 mm high when the Slate Display button has been pressed. However, varying font sizes may be substituted. Embodiments are also envisioned in which the font size is increased but the display is not inverted.

Process 600 then proceeds to 608, at which it is determined whether the user has exited the Slate Display screen. This will occur when the user activates a "Back" or similar button. It should be noted that other methods of de-activating the Slate Display feature of process 600 may be substituted without departing from the scope of the present invention.

If the user has not exited the Slate Display function, process 600 returns to 606 and continues displaying the current display with a one hundred and eighty degree rotation. If the user has exited the Slate Display screen, process 600 returns to 604, the audio recorder display is displayed in its original, non-inverted state, and process 600 continues to monitor for a new activation of the Slate Display feature.

Although several processes have been disclosed herein as software, it is appreciated by one of skill in the art that the same processes, functions, etc. may be performed via hardware or a combination of hardware and software. Similarly, although the present invention has been disclosed with respect to wireless systems, these concepts may be applied to hardwired systems and hybrid hardwired and wireless systems without departing from the scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of extending the dynamic range of a system analog-to-digital conversion system comprising:
 receiving an analog signal;
 amplifying said analog signal via at least one amplifier;
 converting said analog signal amplified by a first of said at least one amplifiers into a first digital signal via a first analog-to-digital conversion system;
 converting said analog signal unamplified, or amplified via a second of said at least one amplifiers, into a second digital signal via a second analog-to-digital conversion system;
 receiving a first sample from said first digital signal;
 receiving a second sample from said second digital signal;
 applying a current calculated gain value to said first sample to create a calculated sample;
 outputting said calculated sample as an output;
 automatically switching said output from said calculated sample to said second sample if said calculated sample exceeds a first setpoint;
 activating a timer to countdown from a maximum value; and
 automatically switching said output from said second sample to said calculated sample upon the expiration of said timer.

2. A method according to claim 1, wherein said gain setting of said first of said at least one amplifiers is manually adjustable.

3. A method according to claim 1, wherein a first initial gain setting of said first of said at least one amplifiers is approximately 20 dB.

4. A method according to claim 1,
 wherein a first initial gain setting of said first of said at least one amplifiers is approximately 20 dB; and
 wherein a second initial gain setting of said second of said at least one amplifiers is selected from the group consisting of approximately 10 dB, approximately −10 dB, and zero.

5. A method according to claim 1, wherein a value of said first setpoint is approximately 3 dB from a clipping value of said first analog-to-digital conversion system.

6. A method according to claim 1 further comprising:
 resetting said maximum value of said timer if said first sample exceeds a second setpoint.

7. A method according to claim 6, wherein a value of said second setpoint is approximately 6 dB from a clipping value of said first analog-to-digital conversion system.

8. A method according to claim 1 further comprising:

calculating a sample difference between said first sample and said second sample;

wherein said current calculated gain value is calculated based upon at least one of the group consisting of said sample difference, a previously calculated gain value, and combinations thereof.

9. A method according to claim 8, wherein said sample difference is calculated by subtracting a first absolute value of a first sample from a second absolute value of said second sample.

10. A method according to claim 8, wherein said sample difference is calculated via a low pass filter equation.

11. A method according to claim 1, wherein said current gain value is calculated by summing a first product and a second product, said first product calculated by multiplying a previously calculated gain value by 0.99, said second product calculated by multiplying said sample difference by 0.01.

12. A system for recording a performance including an audio recorder with integral slate display comprising:
at least one video recorder; and
at least one audio recorder including:
an audio input port;
an analog-to-digital conversion system;
an audio recorder local control unit;
an audio recorder timecode generator;
an audio recorder display;
an audio recorder user interface; and
an audio recorder power supply;
wherein said audio recorder is equipped with an ability to use said audio recorder display as a slate display upon command, said slate display displaying a timecode generated by said audio recorder timecode generator.

13. A system according to claim 12, wherein said audio recorder further includes an external interface port, said external interface port capable of connection to other components of said system for synchronization of at least one timecode generator of said other components with said audio recorder timecode generator.

14. A system according to claim 12, wherein said slate display is inverted relative to said audio recorder display.

\* \* \* \* \*